(12) United States Patent
Nakajima (10) Patent No.: US 6,359,488 B2
(45) Date of Patent: Mar. 19, 2002

(54) CLOCK BUFFER CIRCUIT, AND INTERFACE AND SYNCHRONOUS TYPE SEMICONDUCTOR MEMORY DEVICE WITH CLOCK BUFFER CIRCUIT

(75) Inventor: Takao Nakajima, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/803,466

(22) Filed: Mar. 9, 2001

(30) Foreign Application Priority Data

Mar. 13, 2000 (JP) .......................................... 2000-068971

(51) Int. Cl.⁷ .............................................. H03H 11/26
(52) U.S. Cl. ...................... 327/281; 327/285; 327/299; 327/202; 327/203
(58) Field of Search ................................ 327/391, 278, 327/281, 285, 288, 299, 199, 200, 201, 202, 203, 208, 210, 211, 212, 214, 403, 416, 415

(56) References Cited

U.S. PATENT DOCUMENTS 5,376,848 A * 12/1994 Hanke, III et al. ......... 327/156
5,612,632 A *  3/1997 Mahant-Shetti et al. .... 327/203
5,844,438 A * 12/1998 Lee .............................. 327/291
6,150,862 A * 11/2000 Vikinski ...................... 327/262

* cited by examiner

Primary Examiner—Timothy P. Callahan
Assistant Examiner—An T. Luu
(74) Attorney, Agent, or Firm—Hogan & Hartson, L.L.P.

(57) ABSTRACT

There is provided a semiconductor integrated circuit including a clock buffer capable of suppressing the increase of its chip size and decreasing its electric power consumption even if the capacity increases or even if the functional operations are varied. The semiconductor integrated circuit including a clock buffer circuit comprises: a first delay circuit for receiving a clock signal; a first switching circuit for carrying out a switching action on the basis of the output of the first delay circuit to pass the clock signal therethrough in accordance with the switching action to output the clock signal; a second delay circuit for receiving a clock signal which is obtained by inverting the clock signal; and a second switching circuit for carrying out a switching action on the basis of the output of the second delay circuit to pass the second clock signal therethrough in accordance with the switching action to output the second clock signal, wherein the switching action of the second switching circuit is opposite to the switching action of the first switching circuit, and the output terminals of the first and second switching circuits are commonly connected.

21 Claims, 9 Drawing Sheets

CLOCK BUFFER CIRCUIT, AND INTERFACE AND SYNCHRONOUS TYPE SEMICONDUCTOR MEMORY DEVICE WITH CLOCK BUFFER CIRCUIT

CROSS REFERENCE TO RELATED APPLICATION

This application claims benefit of priority under 35USC §119 to Japanese Patent Application No. 2000-68971, filed on Mar. 13, 2000, the contents of which are incorporated by reference herein.

BACKGROUND OF THE INVENTION

1. Field of the Invention

The present invention relates generally to a clock buffer circuit for generating a pulse every up and down edges of an inputted clock signal, and an interface and synchronous type semiconductor memory device using the clock buffer circuit.

2. Description of Related Art

Typical synchronous type semiconductor memory devices, e.g., synchronous type SRAMs (Static Random Access Memories), use (1) a system driven by increasing its operating frequency, or (2) a system for increasing its data transfer efficiency without changing its operating frequency, in order to realize accelerating.

The synchronous semiconductor memory devices using the system for increasing the data transfer efficiency use a clock buffer circuit for generating a signal synchronized with an inputted clock signal and a signal obtained by inverting the clock signal. In synchronism with the output of the clock buffer, data are transferred.

Figure 8:
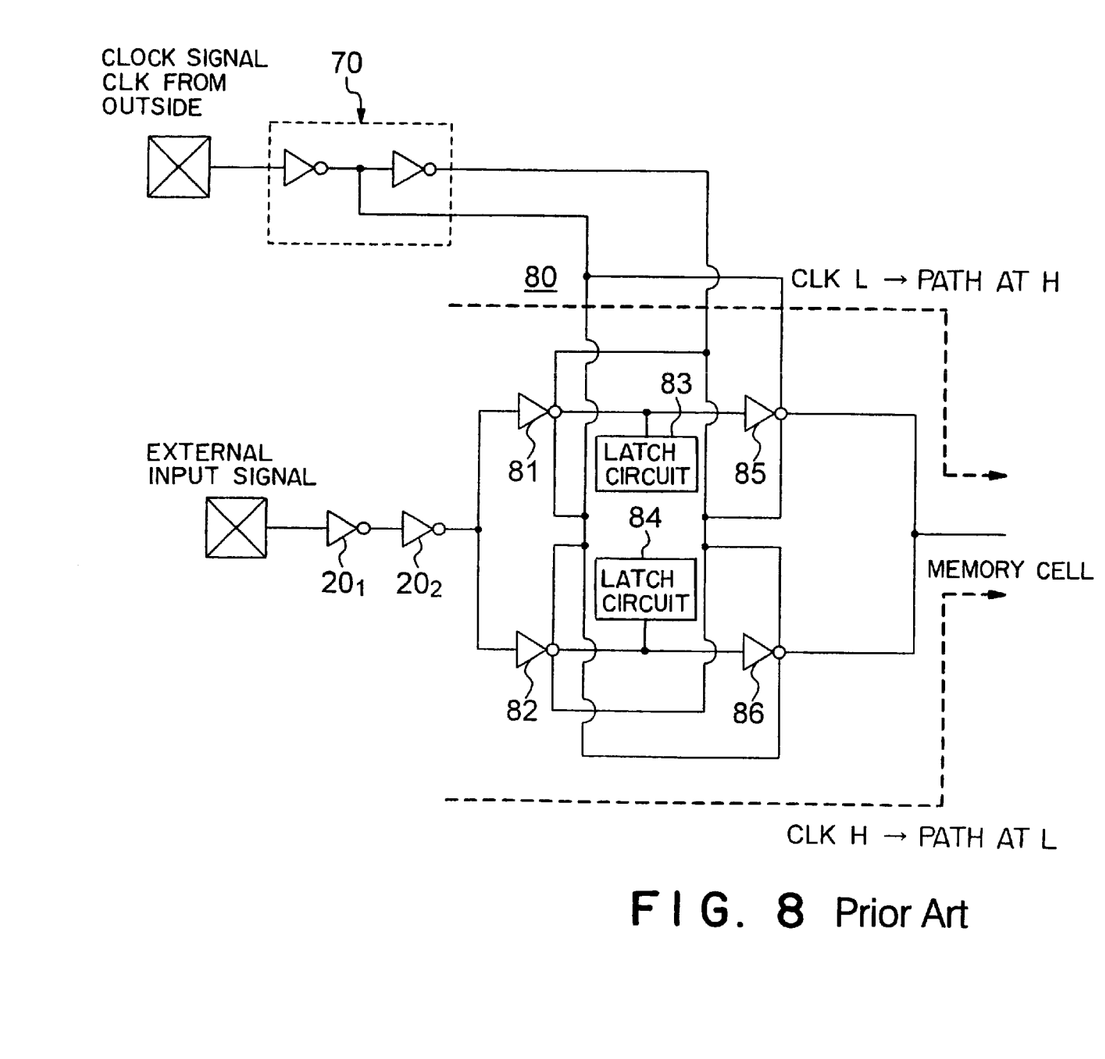
FIG. 8 is a block diagram showing the construction of a conventional synchronous type semiconductor memory device.

The construction of a conventional synchronous type semiconductor memory device using a clock buffer circuit is shown in FIG. 8. This synchronous type semiconductor memory device comprises a memory array (not shown), input buffers $20_1$ and $20_2$, a clock buffer circuit 70 and a register circuit 80.

The clock buffer circuit 70 comprises two inverters connected in series. The clock buffer circuit 70 is designed to receive a clock signal CLK from the outside to output a common mode signal having the same phase as that of the clock signal, and an inverted signal having a phase shifted by 180 degrees from the phase of the clock signal.

The register circuit 80 comprises master latch circuits 81 and 82, latch circuits 83 and 84, and slave latch circuits 85 and 86. The register circuit 80 is designed to latch addresses, data or control input signals, which have been inputted via the input buffers $20_1$ and $20_2$, on the basis of the output of the clock buffer circuit 70, and then, transmit the address, data or control input signals to the memory cell array. The register circuit 80 is provided for each address signal, data input signal and control input signal.

Figure 9:
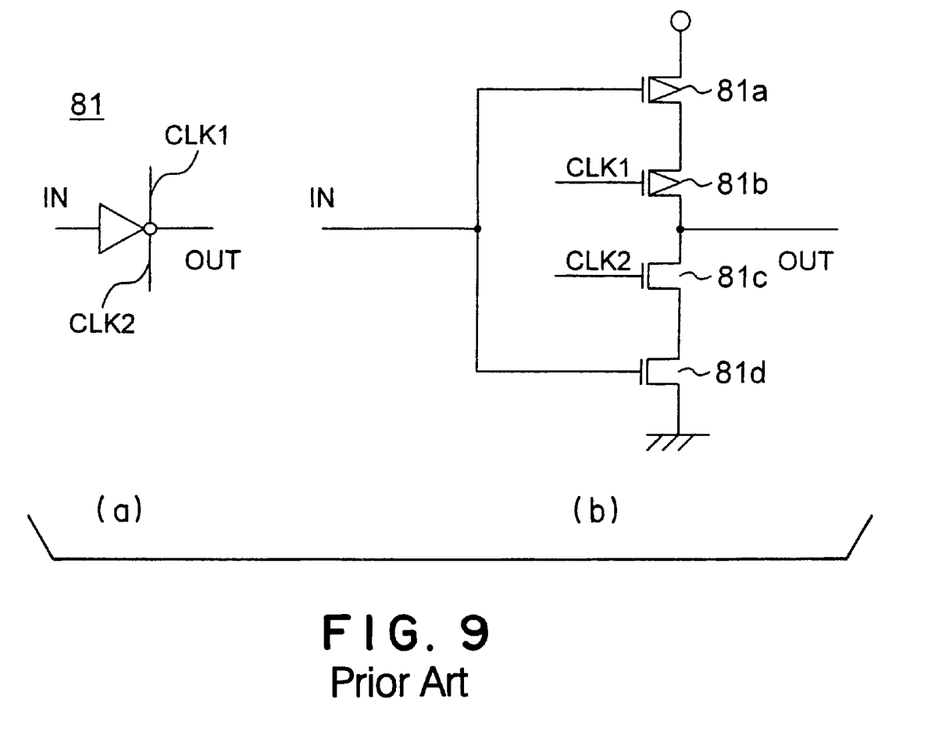
FIG. 9 is a circuit diagram showing the construction of a master latch circuit.

The master latch circuits 81 and 82, and the slave latch circuits 85 and 86 have the same construction. For example, as shown in FIG. 9(a), the circuit 81 comprises a clocked inverter for receiving two clocks CLK1 and CLK2. As shown in FIG. 9(b), the clocked inverter 81 comprises two P-channel MOS transistors 81a and 81b, which are connected in series between a driving power supply and an output terminal OUT, and two N-channel MOS transistors 81c and 81d which are connected in series between a ground power supply and the output terminal OUT. An input signal IN is applied to the gate of the P-channel MOS transistor 81a, the source of which is connected to the driving power supply, and to the gate of the N-channel MOS transistor 81d, the source of which is connected to the ground power supply. The clock CLK1 is applied to the gate of the P-channel MOS transistor 81b, and the clock CLK2 having the opposite phase to that of the clock CLK1 is applied to the gate of the N-channel MOS transistor 81c. Therefore, when the master latch circuit and the slave latch circuit are in closed states, the output has high impedance.

Figure 10:
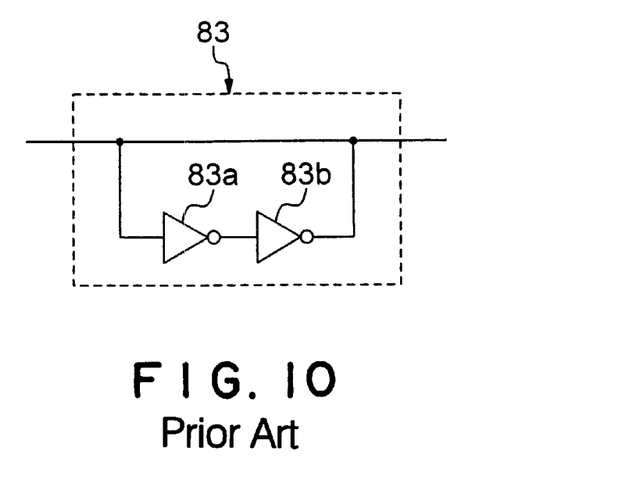
FIG. 10 is a circuit diagram showing the construction of a latch circuit.

The latch circuits 83 and 84 have the same construction. For example, as shown in FIG. 10, the latch circuit 83 comprises two inverters 83a and 83b which are connected in series, and the input terminal of the inverter 83a and the output terminal of the inverter 83b are commonly connected to a node, the potential of which is to be held.

The operation of the conventional synchronous type semiconductor memory device shown in FIG. 8 will be described below.

The switching actions of the master latch circuit 81 and slave latch circuit 86 are designed to be opposite to the switching actions of the master latch circuit 82 and slave latch circuit 85.

Assuming now that the clock signal from the outside has an "L" level, the master latch circuit 81 and the slave latch circuit 86 are in a through state, whereas the master latch circuit 82 and the slave latch circuit 85 are in a closed state. Therefore, an external input signal, such as an address, at this time is transmitted to the slave latch circuit 85 via an input buffer 2 and the master latch circuit 81. However, since the slave latch circuit 85 is in the closed state, i.e., since the output is in a high impedance state, an external output signal is held in the latch circuit 83 without being transmitted to the memory cell. Since the slave latch circuit 86 is in the through state at this time, data having been held in the latch circuit 84 are transmitted to the memory cell via the slave latch circuit 86.

Thereafter, when the level of the clock signal CLK from the outside changes from the "L" level to an "H" level, the output of the clock buffer changes, so that the slave latch circuit 85 is in the through state and the slave latch circuit 86 is in the closed state. Therefore, the external input signal having been held in the latch circuit 83 is transmitted to the memory cell. At this time, the master latch circuit 81 is in the closed state, so that the variation in output of the input buffer $20_2$ is not transmitted to the slave latch circuit 85 even if the output of the input buffer $20_2$ varies. At this time, since the master latch circuit 82 is in the through state, the variation in output of the input buffer $20_2$ is transmitted to the latch circuit 84 to be held therein.

Thereafter, when the level of the clock signal CLK from the outside changes from "H" to "L", the master latch circuit 81 and the slave latch circuit 86 are in the through state, and the master latch circuit 82 and the slave latch circuit 85 in the closed state. Thus, the signal value having been held in the latch circuit 84 is transmitted to the memory cell via the slave latch circuit 86.

As described above, the system shown in FIG. 8 operates in synchronism with both of the up edge (the variation from "L" level to "H" level) and down edge (the variation from "H" level to "L" level) of the clock signal CLK from the outside.

However, if the above described conventional clock buffer circuit 70 is used, two sets of master latch circuits and slave latch circuits must be provided for a single external input signal. For that reason, with the increase of the capacity of semiconductor memory devices (i.e., the increase of address input signals and data input signals) and with the increase of control input signals corresponding to various functional operations, there are problems in that the chip size is very large, the load of the clock buffer increases, and electric power consumption is great.

SUMMARY OF THE INVENTION

It is therefore an object of the present invention to eliminate the aforementioned problems and to provide a clock buffer circuit capable of suppressing the increase of the chip size and decreasing electric power consumption even if the capacity increases or even if the functional operations are varied, and an interface and synchronous type semiconductor memory device having the clock buffer circuit.

In order to accomplish the aforementioned and other objects, according to a first aspect of the present invention, a clock buffer circuit of a semiconductor integrated circuit comprises: a first delay circuit for receiving a first clock signal; a first switching circuit for carrying out a switching action on the basis of an output of the first delay circuit to pass the first clock signal therethrough in accordance with the switching action of the first switching circuit to output the first clock signal; a second delay circuit for receiving a second clock signal which is obtained by inverting the first clock signal; and a second switching circuit for carrying out a switching action on the basis of an output of the second delay circuit to pass the second clock signal therethrough in accordance with the switching action of the second switching circuit to output the second clock signal, wherein the switching action of the second switching circuit is opposite to the switching action of the first switching circuit, and output terminals of the first and second switching circuits are commonly connected.

According to a second aspect of the present invention, a clock buffer of a semiconductor integrated circuit comprises: a first inverter for receiving a first clock signal to output a second signal which is obtained by inverting the first clock signal; a second inverter for receiving the second clock signal to output a third clock signal which has the same phase as that of the first clock signal; a first delay circuit for receiving the third clock signal; a first switching circuit for carrying out a switching action on the basis of an output of the first delay circuit to pass the third clock signal therethrough in accordance with the switching action of the first switching circuit to output the third clock signal; a second delay circuit for receiving the second clock signal; and a second switching circuit for carrying out a switching action on the basis of an output of the second delay circuit to pass through the second clock signal therethrough in accordance with the switching action of the second switching circuit to output the second clock signal, wherein the switching action of the second switching circuit is opposite to the switching action of the first switching circuit, and output terminals of the first and second switching circuits are commonly connected.

According to the present invention, an interface comprises the above described clock buffer circuit and a register which comprises: a master latch circuit for incorporating an input signal on the basis of the output and inverted output of the clock buffer circuit; a first latch circuit for holding an output of the master latch circuit; a slave latch circuit for incorporating an output of the first latch circuit on the basis of the output and inverted output of the clock buffer circuit; and a second latch circuit for holding an output of the slave latch circuit.

According to the present invention, a synchronous type semiconductor memory device includes a memory cell array and the above described interface, wherein the interface is used for accessing the memory cell array.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below.

(First Preferred Embodiment)

Figure 1:
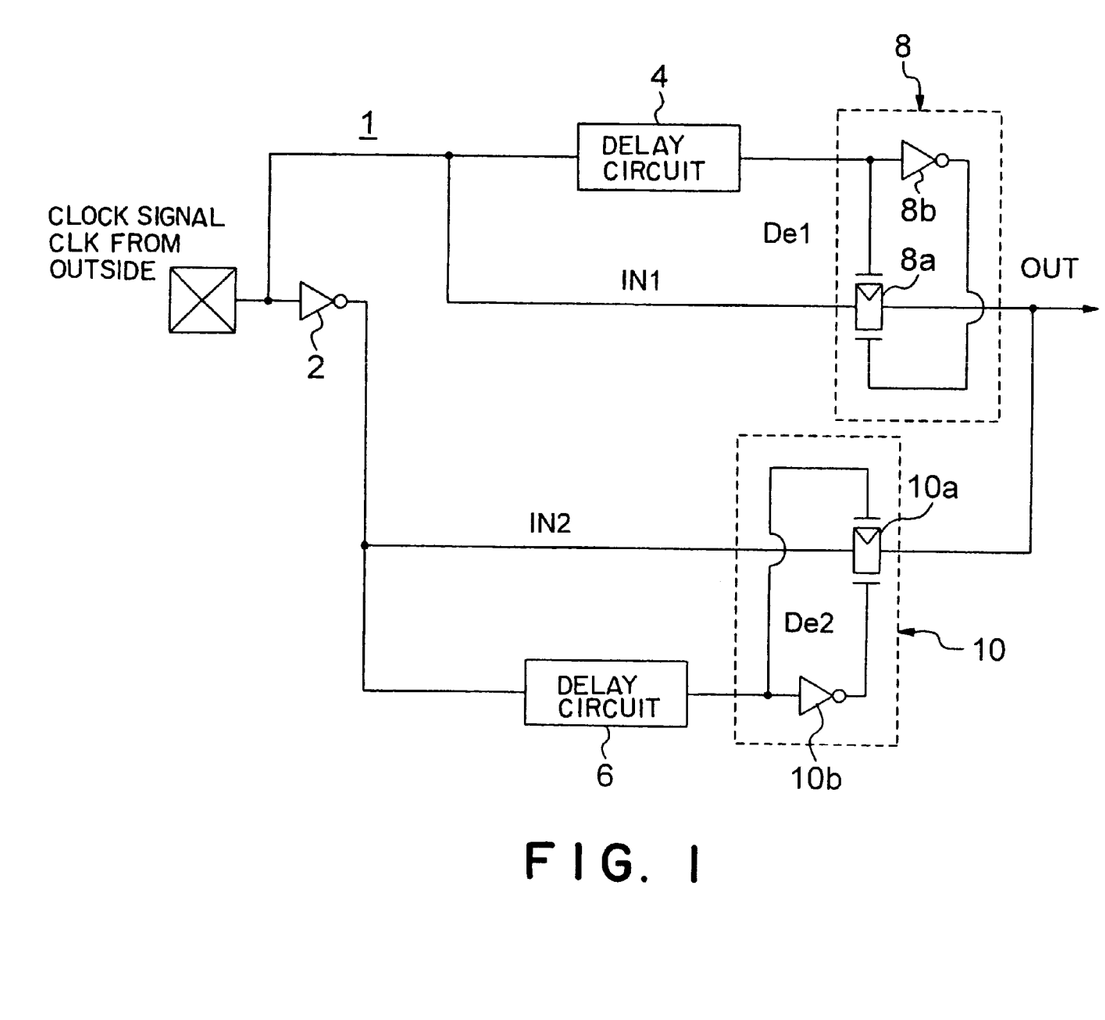
FIG. 1 is a block diagram showing the construction of the first preferred embodiment of the present invention.

The construction of the first preferred embodiment of the present invention is shown in FIG. 1. In this first preferred embodiment, a clock buffer circuit 1 comprises an input buffer 2, delay circuits 4 and 6, and switching circuits 8 and 10.

The input buffer 2 is designed to receive a clock signal CLK from the outside. The delay circuit 4 is designed to receive a clock signal IN1 (=CLK) from the outside to output a clock signal Del delayed by a predetermined period of time. The delay circuit 6 is designed to receive an output IN2 of the input buffer 2, i.e., an inverted signal of the clock signal CLK, to output a signal De2 delayed by a predetermined period of time.

The switching circuit 8 has a transfer gate 8a and an inverter 8b. The inverter 8b is designed to receive the output DE1 of the delay circuit 4 to output an inverted signal of the signal Del. The transfer gate 8a is designed to be open and closed on the basis of the output Del of the delay circuit 4 and the output of the inverter 8b to output the signal IN1 as an output signal OUT in accordance with the switching action.

The switching circuit 10 has a transfer gate 10a and an inverter 10b. The inverter 10b is designed to receive the output De2 of the delay circuit 6 to output an inverted signal of the signal De2. The transfer gate 10a is designed to be open and closed on the output De2 of the delay circuit 6 and the output of the inverter 10b to output the signal IN2 as an output signal OUT in accordance with the switching action.

As can be seen from the above description, when the switching circuit 8 is turned ON, i.e., when the transfer gate 8a is in an open state, the switching circuit is turned OFF, i.e., the transfer gate 10a is a closed state, and when the switching circuit 8 is turned OFF, the switching circuit 10 is turned OFF.

Figure 2:
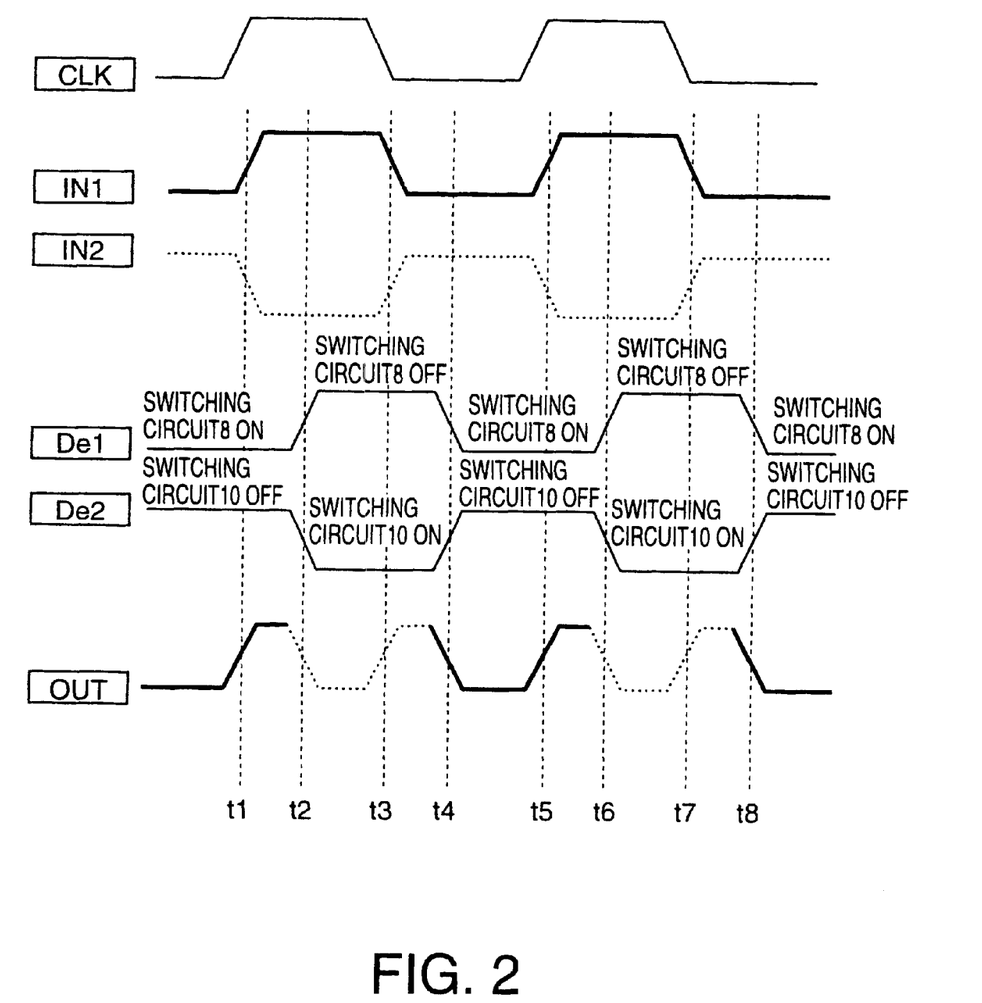
FIG. 2 is a waveform illustration for explaining the operation of the first preferred embodiment.

Referring to FIG. 2, the operation of the clock buffer circuit 1 in this preferred embodiment will be described below.

First, as shown at time $t_1$ in FIG. 2, when the level of the clock signal CLK changes from "L" level to "H" level, the level of the signal IN1 changes from "L" level to "H" level, and the level of the signal IN2 changes from "H" level to "L" level. At this time, the switching circuit 8 is turned ON, and the switching circuit 10 is turned OFF, so that the output signal OUT transmits the variation of the signal IN1 from "L" level to "H" level as it is. That is, the level of the output signal OUT also changes from "L" level to "H" level.

Then, as shown at time $t_2$ in FIG. 2, when a predetermined period of time (a delay time determined by the delay circuits 4, 6 and the inverters 8b, 10b) elapses after the level of the signal IN1 changes from "L" level to "H" level and the level of the signal IN2 changes from "H" level to "L" level, the switching circuit 8 is turned OFF, and the switching circuit 10 is turned ON. Thus, the output signal OUT transmits the state of the signal IN2. At this time, since the level of the signal IN2 is "L" level, the level of the output signal OUT changes from "H" level to "L" level.

Then, as shown at time $t_3$ in FIG. 2, when the level of the clock signal CLK changes from "H" level to "L" level, the level of the signal IN1 changes from "H" level to "L" level, and the level of the signal IN2 changes from "L" level to "H" level. At this time, the switching circuit 8 is turned OFF, and the switching circuit 10 is turned ON, so that the output signal OUT transmits the variation of the signal IN2 from "L" level to "H" level as it is. That is, the output of the output signal OUT also changes from "L" level to "H" level.

Then, as shown at time $t_4$ in FIG. 2, when a predetermined period of time elapses after the level of the signal IN1 changes from "H" level to "L" level and the level of the signal IN2 changes from "L" level to "H" level, the switching circuit is turned ON, and the switching circuit 10 is turned OFF. Thus, the output signal OUT transmits the state of the signal IN1. At this time, the level of the signal IN1 is "L" level, so that the level of the output signal OUT changes from "H" level to "L" level.

Subsequently, at times $t_5$, $t_6$, $t_7$ and $t_8$ in FIG. 2, the same changes as those in times $t_1$, $t_2$, $t_3$ and $t_4$ are repeated.

Thus, in the clock buffer circuit 1 in this preferred embodiment, a pulse is generated every up and down edges of the clock signal CKL from the outside to be outputted as the output OUT. Therefore, as will be described later, the register for storing external input signals, such as addresses, data or control input, in synchronism with the output of the clock buffer circuit has only to have a set of a master latch circuit and a slave latch circuit for each of the external input signals. For that reason, even if the capacity increases or even if the functional operations are varied, it is possible to suppress the increase of the chip size, and it is possible to reduce electric power consumption.

Figure 3:
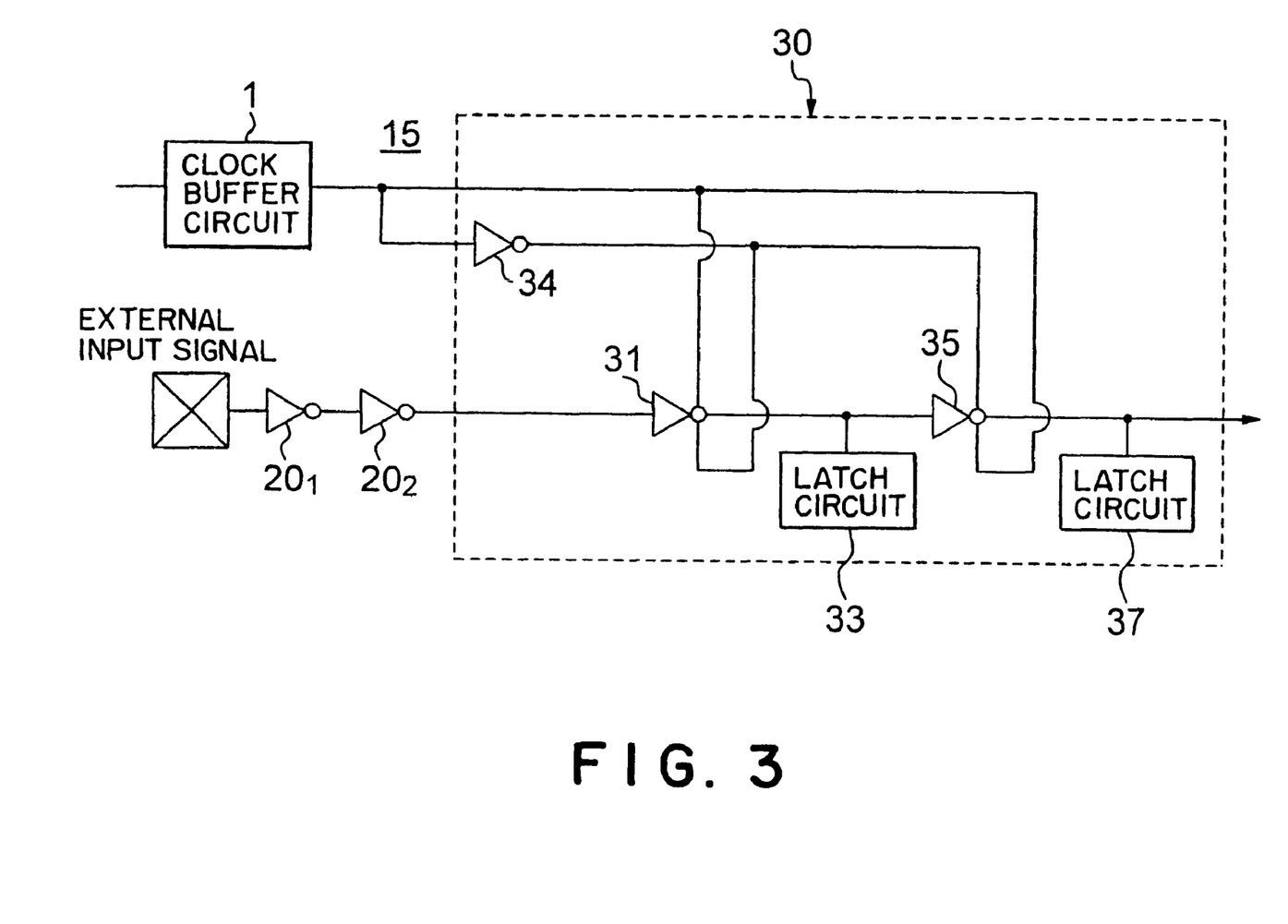
FIG. 3 is a block diagram showing the construction of the second preferred embodiment of the present invention.

Referring to FIG. 3, this will be described below.
(Second Preferred Embodiment)

FIG. 3 is a block diagram showing the construction of the second preferred embodiment of the present invention. In this preferred embodiment, an interface 15 comprises a clock buffer circuit 1, input buffers $20_1$ and $20_2$, and a register 30.

The clock buffer circuit 1 has the same construction as that of the clock buffer circuit 1 in the first preferred embodiment.

The register 30 comprises a master latch circuit 31, a latch circuit 33, an inverter 34, a slave latch circuit 35 and a latch circuit 37. Each of the master latch circuit 31 and the slave latch circuit 35 comprises a clocked inverter.

The master latch circuit 31 is designed to operate in synchronism with an output signal of the clock buffer circuit 1 and an inverted output signal, which is obtained by inverting the output signal by means of the inverter 34, to transmit an external input signal (e.g., address, data or control input), which has been inputted via the input buffers $20_1$ and $20_1$, to the slave latch circuit 35. The latch circuit 33 is designed to hold the output of the master latch circuit 31.

The slave latch circuit 35 is designed to operate in synchronism with an output signal of the clock buffer circuit 1 and an inverted output signal, which is obtained by inverting the output signal by means of the inverter 34, to output the output of the master latch circuit 31, i.e., the value held in the latch circuit 33. The latch circuit 37 is designed to hold the output of the slave latch circuit 35.

When the master latch circuit 31 is in a through state, the slave latch circuit 35 is in a closed state, and when the master latch circuit 31 is a closed state, the slave latch circuit 35 is in a through state.

The operation of the second preferred embodiment will be described below. In order to simplify explanation, it is assumed that the master latch circuit 31 is in the through state when the level of the output of the clock buffer circuit 1 is "H" level, and in the closed state when it is "L" level.

Assuming now that the level of the output of the clock buffer circuit 1 is "H", the master latch circuit 31 is in the through state, and the slave latch circuit is in the closed state. At this time, an external input signal inputted via the input buffers 201 and 202 passes through the master latch circuit 31 to be transmitted to the slave latch circuit 35, but it does not pass through the slave latch circuit 35 since the slave latch circuit 35 is in the closed state. Therefore, the external input signal passing through the master latch circuit 31 is held in the latch circuit 33.

Then, the level of the output of the clock buffer circuit 1 changes from "H" level to "L" level, the master latch circuit 31 is in the closed state, and the slave latch circuit 35 is in the through state. Therefore, the signal having been held in the latch circuit 33 passes through the slave latch circuit 35 to be outputted to the outside. At this time, the output of the slave latch circuit 35 is held in the latch circuit 37.

Thus, in synchronism with the output of the clock buffer circuit 1, the external input signal is temporarily stored and transmitted into the chip.

As described above, it has only to provide a set of a master latch circuit and a slave latch circuit for a single external input signal. For that reason, even if the capacity increases or even if the functional operations are varied, it is possible to suppress the increase of the chip size, and it is possible to reduce electric power consumption.
(Third Preferred Embodiment)

Figure 4:
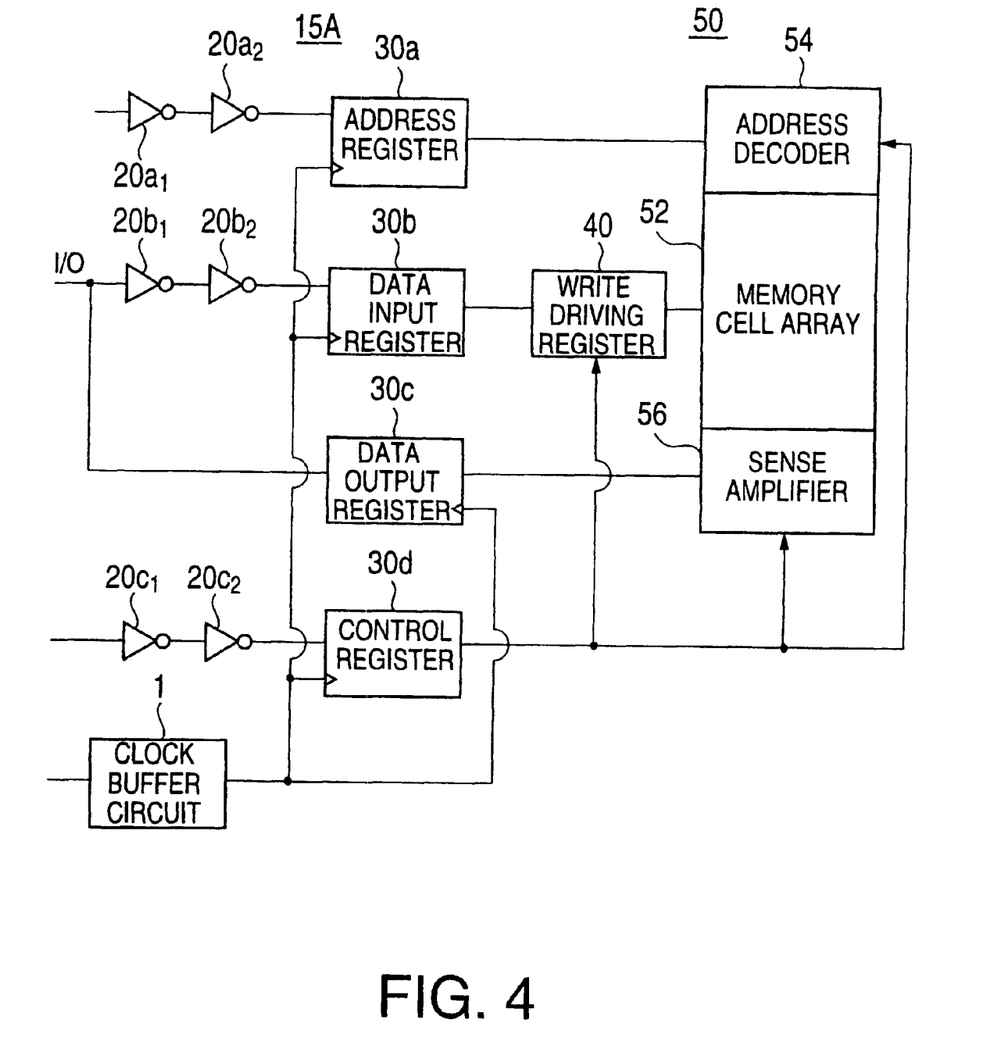
FIG. 4 is a block diagram showing the construction of the third preferred embodiment of the present invention.

Referring to FIG. 4, the third preferred embodiment of the present invention will be described below.

The construction of a synchronous type semiconductor memory device in this preferred embodiment is shown in FIG. 4. In this preferred embodiment, the synchronous type semiconductor device comprises an interface 15A, and a memory body 50. The interface 15A comprises a clock buffer circuit 1, input buffers $20a_1$, $20a_2$, $20b_1$, $20b_2$, $20c_1$ and $20c_2$, an address register 30a, a data input register 30b, a data output register 30c, a control register 30d, and a write driving circuit 40. The memory body 50 comprises a memory cell array 52, an address decoder 54, and a sense amplifier 56.

The clock buffer circuit 1 has the same construction as that of the clock buffer circuit 1 in the first preferred embodiment shown in FIG. 1. That is, a pulse is generated every up and down edges of a clock signal from the outside.

The address register 30a has the same construction as that of the register 30 shown in FIG. 3. The address register 30a is designed to incorporate an address, which is inputted via the input buffers $20a_1$ and $20a_2$, in synchronism with the output of the clock buffer circuit 1 to transmit the incorporated address to the address decoder 54.

The data input register 30b has the same construction as that of the register 30 shown in FIG. 3. The data input register 30b is designed to incorporate an data input, which has been inputted via an input/output terminal and the input buffers $20b_1$ and $20b_2$, in synchronism with the output of the clock buffer circuit 1 to transmit the incorporated data input to the write driving circuit 40.

The data output register 30c has the same construction as that of the register 30 shown in FIG. 3. The data output register 30c is designed to incorporate data of the memory cell array, which has been outputted by the sense amplifier 56, in synchronism with the output of the clock buffer circuit 1 to transmit the incorporated data to the input/output terminal.

The control register 30d has the same construction as that of the register 30 shown in FIG. 3. The control register 30d is designed to incorporate a control signal, which is inputted via the input buffers $20c_1$ and $20c_2$, in synchronism with the output of the clock buffer circuit 1, to transmit the incorporated control signal to the write driving circuit 40, the address decoder 54 or the sense amplifier 56.

The write driving circuit 40 is designed to write data, which are transmitted from the data input register 30b, in the memory cell array 52 on the basis of the control signal which is transmitted from the control register 30d.

In the synchronous type semiconductor memory device in the third preferred embodiment, the clock buffer circuit 1 for generating a pulse every up and down edges of the clock signal from the outside is used, and each of the registers 30a through 30d has only a set of a master latch circuit and a slave latch circuit.

Thus, even if the capacity of the semiconductor device increases or even if the functional operations of the semiconductor device are varied, it is possible to suppress the increase of the chip size, and it is possible to reduce electric power consumption.

(Fourth Preferred Embodiment)

Figure 5:
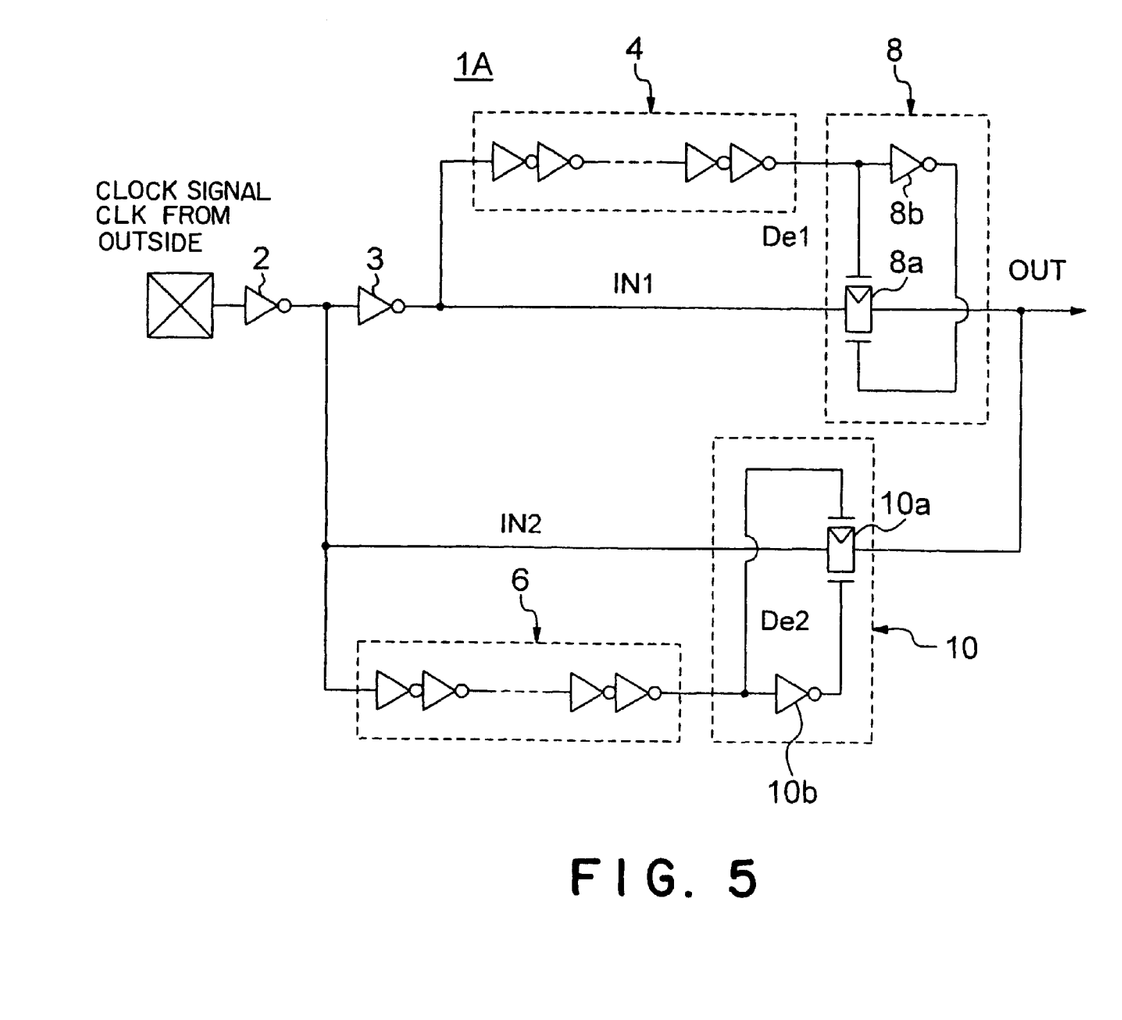
FIG. 5 is a block diagram showing the construction of the fourth preferred embodiment of the present invention.

Referring to FIG. 5, the fourth preferred embodiment of the present invention will be described below.

The construction of the fourth preferred embodiment of a clock buffer circuit according to the present invention is shown in FIG. 5. In the fourth preferred embodiment, the clock buffer circuit 1A is newly provided with an input buffer 3 in the first preferred embodiment shown in FIG. 1, and each of delay circuits 4 and 6 comprises even stages of inverters.

The input buffer 3 is designed to receive the output of an input buffer 2 to transmit an output signal IN1 to a switching circuit 8.

The clock buffer circuit in the fourth preferred embodiment also has the same advantages as those of the clock buffer circuit in the first preferred embodiment.

(Fifth Preferred Embodiment)

Figure 6:
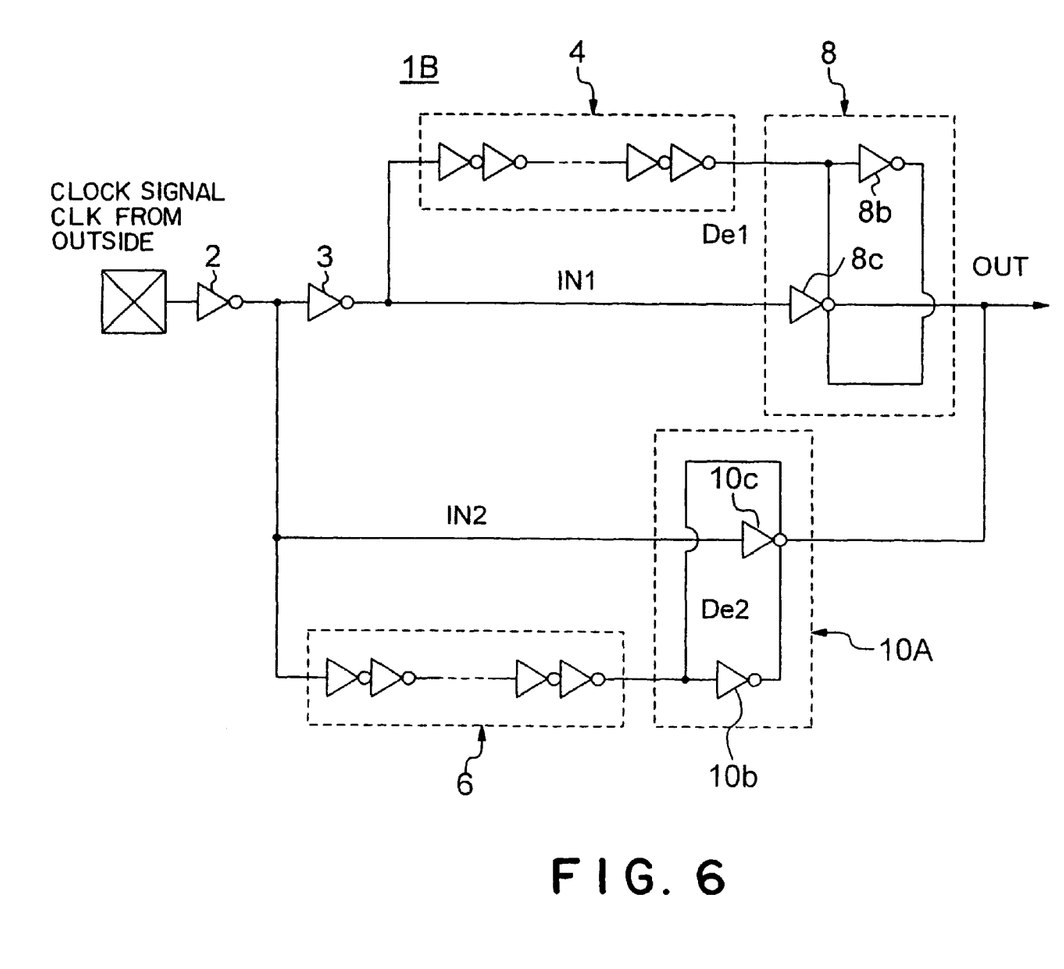
FIG. 6 is a block diagram showing the construction of the fifth preferred embodiment of the present invention.

Referring to FIG. 6, the fifth preferred embodiment of the present invention will be described below.

The construction of the fifth preferred embodiment of a clock buffer circuit according to the present invention is shown in FIG. 6. In the clock buffer circuit 1B in the fifth preferred embodiment, switching circuits 8A and 10A are substituted for the switching circuits 8 and 10 in the clock buffer circuit 1A in the fifth preferred embodiment shown in FIG. 5, respectively.

The switching circuit 8A has a construction wherein a clocked inverter 8c is substituted for the transfer gate 8a of the switching circuit 8. The switching circuit 10A has a construction wherein a clocked inverter 10c is substituted for the transfer gate 10a of the switching circuit 10.

The output OUT of the clock buffer circuit 1B in the fifth preferred embodiment has an opposite potential to that of the output of the clock buffer circuit 1A in the fourth preferred embodiment.

Of course, in the fifth preferred embodiment, there are the same advantages as those of the clock buffer circuit in the fourth preferred embodiment.

(Sixth Preferred Embodiment)

Figure 7:
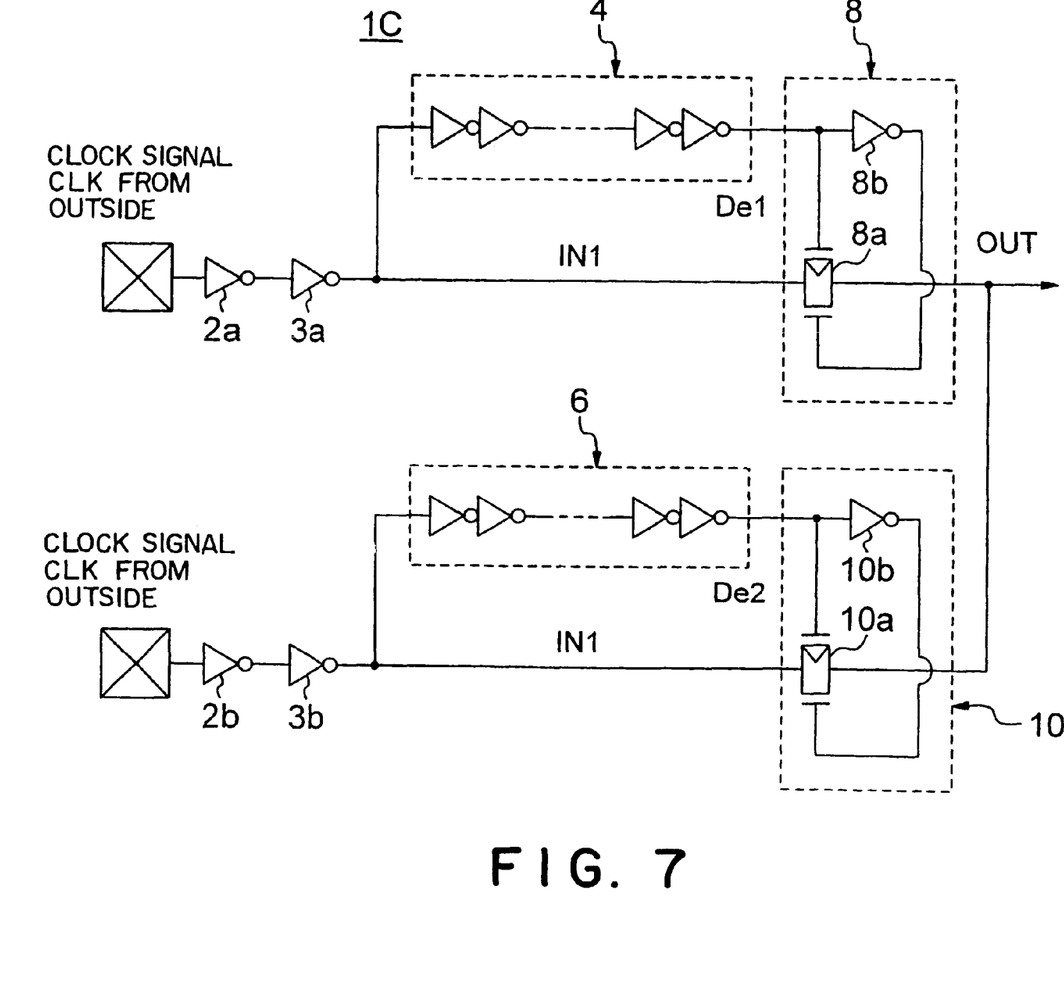
FIG. 7 is a block diagram showing the construction of the sixth preferred embodiment of the present invention.

Referring to FIG. 7, the sixth preferred embodiment of the present invention will be described below.

The construction of the sixth preferred embodiment of a clock buffer circuit according to the present invention is shown in FIG. 7. The clock buffer circuit in the sixth preferred embodiment is designed to receive a clock signal CLK and a clock signal /CLK, which is obtained by inverting the clock signal CLK, from the outside. Therefore, input buffers 2a, 3a, 2b and 3b are provided for the input buffers 2 and 3 in the clock buffer circuit 1A in the fourth preferred embodiment shown in FIG. 5. In addition, a clock signal CLK inputted via the input buffers 2a and 3a is designed to be transmitted to a delay circuit 6 and a switching circuit 10.

Of course, also in the sixth preferred embodiment, there are the same advantages as those in the fourth preferred embodiment.

Of course, the clock buffer circuit in the fourth through sixth preferred embodiment may be used for the interface in the second preferred embodiment or the synchronous type semiconductor memory device in the third preferred embodiment.

As described above, according to the present invention, even if the capacity of the semiconductor device increases or even if the functional operations of the semiconductor device are varied, it is possible to suppress the increase of the chip size, and it is possible to reduce electric power consumption.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor integrated circuit including a clock buffer circuit comprising:

a first delay circuit for receiving a first clock signal;

a first switching circuit for carrying out a switching action on the basis of an output of said first delay circuit to pass said first clock signal therethrough in accordance with said switching action of said first switching circuit to output said first clock signal;

a second delay circuit for receiving a second clock signal which is obtained by inverting said first clock signal; and a second switching circuit for carrying out a switching action on the basis of an output of said second delay circuit to pass said second clock signal therethrough in accordance with said switching action of said second switching circuit to output said second clock signal, wherein said switching action of said second switching circuit is opposite to said switching action of said first switching circuit, and output terminals of said first and second switching circuits are commonly connected.

2. A semiconductor integrated circuit as set forth in claim 1, wherein said clock buffer circuit further comprises a first inverter for receiving said first clock signal to output said second clock signal.

3. A semiconductor integrated circuit as set forth in claim 1, wherein each of said first and second switching circuits is provided with a transfer gate.

4. A semiconductor integrated circuit as set forth in claim 1, wherein each of said first and second switching circuits is provided with a clocked inverter.

5. A semiconductor integrated circuit as set forth in claim 1, which further comprises an interface including a register which comprises:

a master latch circuit for incorporating an input signal on the basis of the output and inverted output of said clock buffer circuit;

a first latch circuit for holding an output of said master latch circuit;

a slave latch circuit for incorporating an output of said first latch circuit on the basis of the output and inverted output of said clock buffer circuit; and a second latch circuit for holding an output of said slave latch circuit.

6. A semiconductor integrated circuit as set forth in claim 5, wherein said clock buffer circuit further comprises a first inverter for receiving said first clock signal to output said second clock signal.

7. A semiconductor integrated circuit as set forth in claim 5, wherein each of said first and second switching circuits is provided with a transfer gate.

8. A semiconductor integrated circuit as set forth in claim 5, wherein each of said first and second switching circuits is provided with a clocked inverter.

9. A semiconductor integrated circuit as set forth in claim 5, which further comprises a memory cell array and wherein said interface is used for accessing said memory cell.

10. A semiconductor integrated circuit as set forth in claim 9, wherein said clock buffer circuit further comprises a first inverter for receiving said first clock signal to output said second clock signal.

11. A semiconductor integrated circuit as set forth in claim 9, wherein each of said first and second switching circuits is provided with a transfer gate.

12. A semiconductor integrated circuit as set forth in claim 9, wherein each of said first and second switching circuits is provided with a clocked inverter.

13. A semiconductor integrated circuit including a clock buffer circuit comprising:

a first inverter for receiving a first clock signal to output a second clock signal which is obtained by inverting said first clock signal;

a second inverter for receiving said second clock signal to output a third clock signal which has the same phase as that of said first clock signal;

a first delay circuit for receiving said third clock signal;

a first switching circuit for carrying out a switching action on the basis of an output of said first delay circuit to pass said third clock signal therethrough in accordance with said switching action of said first switching circuit to output said third clock signal;

a second delay circuit for receiving said second clock signal; and a second switching circuit for carrying out a switching action on the basis of an output of said second delay circuit to pass through said second clock signal therethrough in accordance with said switching action of said second switching circuit to output said second clock signal, wherein said switching action of said second switching circuit is opposite to said switching action of said first switching circuit, and output terminals of said first and second switching circuits are commonly connected.

14. A semiconductor integrated circuit as set forth in claim 13, wherein each of said first and second switching circuits is provided with a transfer gate.

15. A semiconductor integrated circuit as set forth in claim 13, wherein each of said first and second switching circuits is provided with a clocked inverter.

16. A semiconductor integrated circuit as set forth in claim 13, which further comprises an interface including a register which comprises:

a master latch circuit for incorporating an input signal on the basis of the output and inverted output of said clock buffer circuit;

a first latch circuit for holding an output of said master latch circuit;

a slave latch circuit for incorporating an output of said first latch circuit on the basis of the output and inverted output of said clock buffer circuit; and a second latch circuit for holding an output of said slave latch circuit.

17. A semiconductor integrated circuit as set forth in claim 16, wherein each of said first and second switching circuits is provided with a transfer gate.

18. A semiconductor integrated circuit as set forth in claim 16, wherein each of said first and second switching circuits is provided with a clocked inverter.

19. A semiconductor integrated circuit as set forth in claim 16, which further comprises a memory cell array and wherein said interface is used for accessing said memory cell.

20. A semiconductor integrated circuit as set forth in claim 19, wherein each of said first and second switching circuits is provided with a transfer gate.

21. A semiconductor integrated circuit as set forth in claim 19, wherein each of said first and second switching circuits is provided with a clocked inverter.

* * * * *